United States Patent [19]

Bremmer et al.

[11] Patent Number: 5,707,681

[45] Date of Patent: Jan. 13, 1998

[54] METHOD OF PRODUCING COATINGS ON ELECTRONIC SUBSTRATES

[75] Inventors: Jeffrey Nicholas Bremmer; Youfan Liu, both of Midland, Mich.

[73] Assignee: Dow Corning Corporation, Midland, Mich.

[21] Appl. No.: 798,405

[22] Filed: Feb. 7, 1997

[51] Int. Cl.$^6$ ........................................... B05N 5/12
[52] U.S. Cl. .................... 427/58; 427/240; 427/376.2; 427/387
[58] Field of Search ............... 427/58, 240, 376.2, 427/387

[56] References Cited

U.S. PATENT DOCUMENTS

| | | | |
|---|---|---|---|
| 3,615,272 | 10/1971 | Collins et al. | 23/366 |
| 4,753,855 | 6/1988 | Haluska et al. | 428/700 |
| 4,756,977 | 7/1988 | Haluska et al. | 428/704 |
| 4,973,526 | 11/1990 | Haluska | 428/687 |
| 4,999,397 | 3/1991 | Weiss et al. | 524/755 |
| 5,010,159 | 4/1991 | Bank et al. | 528/23 |
| 5,011,706 | 4/1991 | Tarhay et al. | 427/39 |
| 5,063,267 | 11/1991 | Hanneman et al. | 524/284 |
| 5,145,723 | 9/1992 | Ballance et al. | 427/397.7 |
| 5,336,532 | 8/1994 | Holuska et al. | 427/515 |
| 5,370,903 | 12/1994 | Mine et al. | 427/126.2 |
| 5,370,904 | 12/1994 | Mine et al. | 427/126.2 |
| 5,416,190 | 5/1995 | Mine et al. | 528/492 |
| 5,436,029 | 7/1995 | Ballance et al. | 427/126.2 |

FOREIGN PATENT DOCUMENTS

| | | | |
|---|---|---|---|
| 59-178749 | 3/1983 | Japan | H01L 21/3205 |
| 60-86017 | 5/1985 | Japan | C01B 33/00 |
| 61-252016 | 10/1986 | Japan | H01L 21/312 |

*Primary Examiner*—Benjamin Utech
*Attorney, Agent, or Firm*—Sharon K. Severance

[57] ABSTRACT

This invention pertains to a method for producing an insoluble coating on a substrate by curing a composition comprising hydrogen silsesquioxane at a temperature of 375° C. or less for a time sufficient to produce a coating having >80% SiH. It has been found that when the hydrogen silsesquioxane resin is cured at a temperature of 375° C. or less that that the insoluble SiH containing coating shows improved film stress.

13 Claims, No Drawings

METHOD OF PRODUCING COATINGS ON ELECTRONIC SUBSTRATES

BACKGROUND OF THE INVENTION

This invention pertains to a method of forming coatings on electronic substrates by applying to the substrate a hydrogen silsesquioxane resin and thereafter curing the hydrogen silsesquioxane resin at a temperature of less than 375° C. for a time sufficient to convert the hydrogen silsesquioxane resin into an insoluble coating wherein the coating contains >80% SiH. These coatings show improved film stress than coatings containing ≦80% SiH.

The use of hydrogen silsesquioxane resin to produce ceramic coatings on electronic devices in known in the art. For example, U.S. Pat. No. 4,756,977 to Haluska et al. describes a method for producing ceramic coatings by curing hydrogen silsesquioxane resin in an air environment. U.S. Pat. No. 5,370,904 to Mine et. al. discloses a method for producing ceramic coatings by curing hydrogen silsesquioxane resin in an inert gas at a temperature of 250° to 500° C. until the content of the Si-bonded H in the silicon oxide product has reached ≦80% of the Si-bonded H in the starting hydrogen silsesquioxane. U.S. Pat. No. 5,370,903 to Mine et al. discloses a method for producing ceramic coatings by curing hydrogen silsesquioxane resin in an atmosphere containing >0% up to 20 vol % oxygen and 80 to <100 vol % nitrogen at temperature of 250° C. to <500° C. until the content of the Si-bonded H in the silicon oxide product has reached ≦80% of the Si-bonded H in the starting hydrogen silsesquioxane. These patents all teach methods wherein the object is to produce $SiO_2$ ceramic coatings from the hydrogen silsesquioxane resin.

It has now been found that hydrogen silsesquioxane resin can be cured to an insoluble state even though the cured coating contains >80% of the Si-bonded H in the starting resin. Unexpectedly, the cured resin with >80% retained SiH content has been found to exhibit desirable properties such as reduced film stress which make the coatings suitable for use invarious electronic devices. This can be achieved without sacrificing other properties such as dielectric constant. Additionally, the coatings are less dense (more porous) than those produced by known curing methods.

SUMMARY OF THE INVENTION

This invention pertains to a method for producing a coating on an electronic substrate by heating hydrogen silsesquioxane resin at a temperature of 375° C. or less for a time sufficient such that the cured coating contains >80% SiH. It has been found that the film stress of coating is reduced when the hydrogen silsesquioxane resin is heated to 375° C. or less for a time sufficient such to produce an insoluble coating containing 80% SiH

THE INVENTION

The instant invention pertains to a method of producing a coating on an electronic substrate wherein the method comprises applying to the substrate a composition comprising a hydrogen silsesquioxane resin and thereafter heating the hydrogen silsesquioxane at a temperature of 375° C. or less for a period of time sufficient to convert the hydrogen silsesquioxane resin into an insoluble coating containing >80% SiH, preferably >85% SiH. In addition to the silicon bonded hydrogen (SiH), the insoluble coating may contain amorphous silica ($SiO_2$), amorphous silica-like materials that are not fully free of residual carbon, silanol (SiOH) and/or additional ceramic materials. By "insoluble" it is meant a SiH containing coating that is not soluble in the solvent from which the hydrogen silsesquioxane resin was dispensed to form the coating.

The hydrogen silsesquioxane resin which may be used in this invention includes hydridosiloxane resins containing units of the formula $HSi(OH)_x(OR)_yO_{z/2}$, in which each R is independently an organic group or a substituted organic group which, when bonded to silicon through the oxygen atom, forms a hydrolyzable substituent, x=0 to 2, y=0 to 2, z=1 to 3, x+y+z=3. Examples of R include alkyls such as methyl, ethyl, propyl, butyl, etc., aryls such as phenyl, and alkenyls such as allyl or vinyl. These resins may be fully condensed $(HSiO_{3/2})_n$ wherein n is an having a value of at least 8, preferably 8 to 1,000; or they may be only partially hydrolyzed (i.e., containing some Si—OR) and/or partially condensed (i.e., containing some Si—OH). Although not represented by this structure, these resins may also contain a small number (e.g., less than about 10%) of silicon atoms which have either 0 or 2 hydrogen atoms attached thereto or a small number of SiC bonds due to various factors involved in their formation or handling.

The above H-resins and methods for their production are known in the art. For example, Collins et al. in U.S. Pat. No. 3,615,272, which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159, which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference, those produced by hydrolyzing an alkoxy or acyloxy silane in an acidic, alcoholic hydrolysis medium, those described in Kokai Patent Nos. 59-178749, 60-86017 and 63-107122, or any other equivalent hydridosiloxane, will also function herein.

It is to be noted that in a preferred embodiment of the invention, specific molecular weight fractions of the above H-resins may also be used in this process. Such fractions and methods for their preparation are taught by Hanneman et al. in U.S. Pat. Nos. 5,063,267 and 5,416,190 which are hereby incorporated by reference. A preferred fraction comprises material wherein at least 75% of the polymeric species have a molecular weight above about 1200 and a more preferred fraction comprises material wherein at least 75% of the polymeric species have a number average molecular weight of from 1200 to 100,000.

The hydrogen silsesquioxane resin may contain a platinum, rhodium or copper catalyst. Generally, any platinum, rhodium or copper compound or complex which can be solubilized will be functional. For instance, platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of 5 to 1000 ppm platinum, rhodium or copper based on the weight of hydrogen silsesquioxane resin.

The hydrogen silsesquioxane resin alternately, may also contain an organic or inorganic peroxide. Organic and inorganic peroxides useful in the instant invention may be exemplified by, but not limited to barium peroxide, strontium peroxide, calcium peroxide, α, α-bis tertiary peroxydiisopropylbenzene, dicumyl peroxide, benzoyl peroxide and others.

Other ceramic oxide precursors may also be used in combination with the above hydrogen silsesquioxane resin. The ceramic oxide precursors specifically contemplated herein include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed at relatively low temperatures to form ceramic oxides. The use of the ceramic oxide precursors is described in U.S. Pat. Nos. 4,753,855 and 4,973,526, herein incorporated by reference.

The above ceramic oxide precursors generally have one or more hydrolyzable groups bonded to the above metal or non-metal, depending on the valence of the metal. The number of hydrolyzable groups to be included in these compounds is not critical as long as the compound is soluble or can be dispersed in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, other organic groups bonded to said metal or non-metal through an oxygen such as acetylacetonate or amino groups. Specific compounds, therefore, include zirconium tetracetylacetonate, titanium dibutoxy diacetylacetonate, aluminum triacetylacetonate, tetraisobutoxy titanium and $Ti(N(CH_3)_2)_4$.

When a ceramic oxide precursor is combined with the hydrogen silsesquioxane resin, generally it is used in an amount such that the coating composition contains 0.1 to 30 percent by weight ceramic oxide precursor based on the weight of the hydrogen silsesquioxane resin.

If desired, other materials may also be present in the coating composition. For example, adhesion promoters, suspending agents and other optional components may be added. The adhesion promoters may be exemplified by, but not limited to silanes such as glycidoxypropyltrimethoxysilane, mercaptopropyltrimethoxysilane, vinyl triacetoxysilane and others.

The hydrogen silsesquioxane resin may be applied to the substrate in any manner, but a preferred method involves producing a solvent dispersion of the hydrogen silsesquioxane resin and any optional components and applying the solvent dispersion to the surface of the substrate. Various facilitating means such as stirring and/or heating may be used to dissolve or disperse the hydrogen silsesquioxane resin and create a more uniform application material.

Solvents which may be used include any agent or mixture of agents which will dissolve the hydrogen silsesquioxane resin to form a homogeneous liquid mixture without affecting the resulting coating. These solvents can include alcohols such as ethyl alcohol or isopropyl alcohol; aromatic hydrocarbons such as benzene or toluene; alkanes such as n-heptane, dodecane or nonane; ketones; esters; glycol ethers; or dimethylpolysiloxanes. The solvent is present in an amount sufficient to dissolve the hydrogen silsesquioxane resin to the concentration desired for application. Typically the solvent is present in an amount of 20 to 99.9 wt %, preferably from 50 to 99 wt %, based on the weight of the coating composition.

The hydrogen silsesquioxane resin may be applied to any substrate such as metals or ceramics however, it is preferred to apply the hydrogen silsesquioxane resin to an electronic substrate. By "electronic substrate" it is meant to include silicon based devices and gallium arsenide based devices intended for use in the manufacture of a semiconductor component including focal plane arrays, opto-electronic devices, photovoltaic cells, optical devices, transistor-like devices, 3-D devices, silicon-on-insulator devices, super lattice devices and the like. To further exemplify, electronic substrates include wafers resulting from the fabrication of integrated circuits and semiconductor devices. Typically the devices are completely fabricated up to the point of the interconnect system, usually bond pads, while still in the wafer stage. It is desirable and economical to apply these coatings to the electronic devices while they are still in the wafer stage as an electronic substrate. Such coated devices are then separated from each other and continued into the packaging and assembly stages. Alternately, the electronic substrates can be the actual separated semiconductor devices or integrated circuit devices, before or after the interconnects are made to an electronic assembly.

Specific methods for application of the solvent dispersion include, but are not limited to spin coating, dip coating, spray coating, flow coating, screen printing or others. The solvent is then allowed to evaporate from the coated substrate resulting in the deposition of the hydrogen silsesquioxane resin. Any suitable means for evaporation may be used such as simple air drying by exposure to an ambient environment, by the application of a vacuum, or mild heat ($\leq 50°$) or during the early stages of the curing process. It should be noted that when spin coating is used, the additional drying method is minimized as the spinning drives off the solvent.

Following removal of any solvent, a coating of hydrogen silsesquioxane resin is formed on the substrate. The hydrogen silsesquioxane coating may be subjected to an intermediate heating in an inert atmosphere to melt and flow the hydrogen silsesquioxane resin. Typically this intermediate heating is carried out at a temperature of from 150° C. to 400° C. and for very short periods of time. Due to the short periods of time that the coating is heating, there is no or incidental curing of the hydrogen silsesquioxane resin.

The hydrogen silsesquioxane coating is converted to an insoluble SiH containing coating by exposing the hydrogen silsesquioxane resin to a temperature of 375° C. or less, preferably at or about 350° C., for a time sufficient to convert the hydrogen silsesquioxane coating to an insoluble coating containing >80% SiH. Typically, the coatings are heated for a period of less than 10 hours, preferably from 0.5 to 1.5 hours to produce coatings having >80% SiH.

The heating preferably takes place in an inert atmosphere, although other atmospheres may be used. Inert atmospheres useful herein include, but are not limited to, nitrogen, helium and argon, preferably nitrogen. The amount of SiH bond density in the final coating is determined based on the amount of SiH bond density in the soluble hydrogen silsesquioxane resin coating, as applied on the substrate.

Any method of heating such as the use of a convection oven, rapid thermal processing, hot plate, or radiant of microwave energy may be used herein. The rate of heating is also not critical but is most practical and preferred to heat as rapidly as possible.

By the above methods a thin (less than 2 microns) insoluble SiH containing coating is produced on the substrate having improved film stress. The coating smoothes the irregular surfaces of the various substrates and has excellent adhesion properties.

Additional coatings may be applied over the insoluble SiH containing coating if desired. These can include, for example SiO₂ coatings, SiO₂/ceramic oxide layers, silicon containing coatings, silicon carbon containing coatings, silicon nitrogen containing coatings, silicon oxygen nitrogen containing coatings, silicon nitrogen carbon containing coatings and/or diamond like coatings produced from deposition (i.e. CVD, PECVD, etc.) of amorphous SiC:H, diamond, silicon nitride. Methods for the application of such coatings are known in the art and are described, for example in U.S. Pat. No. 4,756,977 and U.S. Pat. No. 5,011,706, both of which are herein incorporated by reference.

The method of applying an additional coating such as silicon carbide is not critical, and such coatings can be applied by any chemical vapor deposition technique such as thermal chemical vapor deposition (TCVD), photochemical vapor deposition, plasma enhanced chemical vapor deposition (PECVD), electron cyclotron resonance (ECR), and jet vapor deposition. It could also be applied by physical vapor deposition techniques such as sputtering or electron beam evaporation. These processes involve either the addition of energy in the form of heat or plasma to a vaporized species to cause the desired reaction, or they focus energy on a solid sample of the material to cause its deposition.

So that those skilled in the art can understand and appreciate the invention taught herein, the following examples are presented, it being understood that these examples should not be used to limit the scope of this invention found in the claims.

Soak Temperature and Soak Time represent the temperature the furnace was heated to for curing and the amount of time that it was held at this temperature during the cure.

Thickness After Cure was determined by using a NanoSpec/AFT Model 2100 Automated Film Thickness Instrument. Thickness was determined by a method of reflection spectroscopy whereby visible light is reflected from the surface of the measurement sample into a specially designed microscope. Film thickness is determined from the measured interferogram of reflection intensity as a function of wavelength with the use of a curve fitting algorithm provided by the vendor.

Dielectric Constant of the converted coating was determined by performing dielectric constant measurements on metal-insulator-semiconductor (MIS) capacitors. MIS capacitors were formed by depositing aluminum electrodes of approximately 0.15 μm unto low resistivity (ρ≦0.025Ω cm) silicon wafers coated with a thin film of the insoluble coating. A shadow mask was utilized to form aluminum electrode dots of diameter ranging from 3 to 10 mm. Impedance measurements were made across electrode dots of same diameter over frequency range of 0.1–1000 kHz using a Hewlett-Packard 4194A Impedance Analyzer. The impedance data was fit to a series RLC model from which the equivalent parallel capacitance and dielectric constant were calculated. Since impedance was characterized across the surface dot electrodes, twice the dielectric thickness was used for dielectric constant measurements.

% SiH remaining after cure was determined by FTIR. This FTIR method comprised using a Nicolet 5SXB Fourier Transform Infrared Spectrometer. A transmission sampling mode of operation was utilized. Prior to the spin coating of the wafer with the coating composition, a background spectra was collected on bare silicon wafers. The background was subtracted from a wafer having the insoluble film thereon to obtain spectra of the insoluble film only. A peak at wavenumber 2260 cm⁻¹ is indicative of the SiH bond density in the converted film. A ratio of this peak area per film thickness to an as spun film peak area per thickness was quantified to determine the normalized SiH bond density.

Film Stress was determined by using a Tencor P-1 Long Scan Profilometer. Stress was calculated from the change in wafer curvature as measured over the center 90% of the wafer diameter. The following relationship was utilized to calculate stress based on thin film stress modeled by a beam bending method.

$$\sigma = (1/6R)*(E/(1-\upsilon))*(t_s^2/t_f)$$

where

σ=film stress

R=radius of curvature

E/(1−υ)=substrate elastic constant $t_s$=substrate thickness $t_f$=film thcikness Film Density was determined by separately characterizing mass and volume of the film on wafer. A gravimetric method was utilized to determine mass by subtracting the wafer mass from the wafer with film after thermal processing with a Metler AE240 mass balance. Volume of film was determined from the product of film thickness and film area on wafer. Reported density is an average of three films.

EXAMPLE 1

Sample wafers were coated with a coating composition comprising 22 wt % hydrogen silsesquioxane resin $(HSiO_{3/2})_n$ prepared according to U.S. Pat. No. 3,615,272 to Collins et al. in methyl isobutyl ketone to a pre-cured thickness of 5200 Å on a SEMIX 6132U spin coater followed by sequential bakes on three open ended nitrogen purged hot plates at 150°, 200°, and 350° C. for one minute each. The wafers were then heated in a quartz tube furnace heated to 350° C. under a nitrogen atmosphere. Results are given in Table 1. These results demonstrate that when there is ≧80% SiH in the final coating, the film stress is significantly improved.

TABLE 1

Example 1 Conditions and Results

| Run No. | Soak Temp (°C.) | Soak Time (hr) | Thickness After Cure (Å) | % SiH Remaining After Cure | Dielectric Constant | Film Stress (MPa) | Film Density (g/cc) |
|---|---|---|---|---|---|---|---|
| 1 | 350 | 0.5 | 5259 | 89 | 2.8 | 48 | 1.40 |
| 2 | 350 | 1 | 5033 | 89 | 2.8 | 43 | 1.40 |
| 3 | 350 | 1 | 5192 | 87 | 2.9 | 49 | 1.36 |
| 4 | 350 | 1.5 | 5243 | 87 | 2.9 | 43 | 1.42 |
| C-5 | 350 | 10 | 5106 | 80 | n.d | 55 | n.d |
| C-6 | 350 | 20 | 5090 | 67 | 2.8 | 95 | n.d |
| C-7 | 350 | 40 | 4923 | 52 | 2.8 | 127 | n.d | n.d. = not determined

What is claimed is:

1. A method of forming an insoluble coating on a substrate wherein said method comprises (A) coating the substrate with a coating composition comprising a soluble hydrogen silsesquioxane resin having silicon-bonded hydrogen to form a soluble hydrogen silsesquioxane resin coating on the substrate;

(B) heating the soluble hydrogen silsesquioxane resin coating to a temperature of 375° C. or less for a period of time sufficient to convert the hydrogen silsesquioxane resin coating into an insoluble final coating retaining in the insoluble final coating >80% of the silicon-bonded hydrogen from the soluble hydrogen silsesquioxane resin.

2. The method as claimed in claim 1 wherein the coating composition additionally comprises a solvent and the solvent is evaporated to form the hydrogen silsesquioxane resin coating on the substrate.

3. The method as claimed in claim 2 wherein the coating composition contains from 20 to 99.9 weight % solvent based on the weight of the coating composition.

4. The method as claimed in claim 2 wherein the solvent is selected from the group consisting of alcohols, aromatic hydrocarbons, alkanes, ketones, esters, glycol ethers, and dimethylpolysiloxanes.

5. The method as claimed in claim 1 wherein the hydrogen silsesquioxane resin is a resin having units of the formula $HSi(OH)_x(OR)_yO_{z/2}$, in which each R is independently an organic group or a substituted organic group which, when bonded to silicon through the oxygen atom, forms a hydrolyzable substituent, wherein x=0 to 2, y=0 to 2, z=1 to 3, and x+y+z=3.

6. The method as claimed in claim 1 wherein the hydrogen silsesquioxane resin is a resin having the formula $(HSiO_{3/2})_n$ wherein n is an integer having a value of at least 8.

7. The method as claimed in claim 1 wherein the coating composition further comprises a catalyst containing an element selected from the group consisting of platinum, rhodium and copper.

8. The method as claimed in 7 wherein the catalyst is present in an amount sufficient to provide 5 to 1000 ppm platinum, rhodium or copper based on the weight of the hydrogen silsesquioxane resin.

9. The method as claimed in claim 1 wherein the coating composition further contains a ceramic oxide precursor comprising a compound containing an element selected from the group consisting of aluminum, titanium, zirconium, tantalum, niobium, vanadium, boron and phosphorous and wherein the compound contains at least one hydrolyzable substituent selected from the group consisting of alkoxy and acyloxy and the compound is present in an amount such that the coating composition contains from 0.1 to 30 weight % of the ceramic oxide precursor based on the weight of hydrogen silsesquioxane resin.

10. The method as claimed in claim 1 wherein the substrate is coated by spin coating.

11. The method as claimed in claim 1 wherein the substrate is an electronic substrate.

12. The method as claimed in claim 1 wherein the hydrogen silsesquioxane resin coating is heated to a temperature of 350° C.

13. The method as claimed in claim 1 wherein the coating produce in (B) contains $\geq 8\%$ silicon-bonded hydrogen.

* * * * *